(12) United States Patent
Ogasawara et al.

(10) Patent No.: US 9,151,455 B2
(45) Date of Patent: Oct. 6, 2015

(54) THERMOPLASTIC RESIN COMPOSITION FOR REFLECTOR, REFLECTOR PLATE, AND LIGHT-EMITTING DIODE ELEMENT

(75) Inventors: Hideto Ogasawara, Sodegaura (JP); Takashi Hama, Chiba (JP); Nobuhiro Takizawa, Kamakura (JP); Akinori Amano, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 14/124,451

(22) PCT Filed: Jun. 7, 2012

(86) PCT No.: PCT/JP2012/003724
§ 371 (c)(1),
(2), (4) Date: Dec. 6, 2013

(87) PCT Pub. No.: WO2012/169193
PCT Pub. Date: Dec. 13, 2012

(65) Prior Publication Data
US 2014/0097737 A1 Apr. 10, 2014

(30) Foreign Application Priority Data

Jun. 8, 2011 (JP) ................... 2011-128576
Dec. 14, 2011 (JP) ................... 2011-273927

(51) Int. Cl.
| | | |
|---|---|---|
| C08L 101/06 | (2006.01) |
| C08K 3/18 | (2006.01) |
| C08K 7/08 | (2006.01) |
| G02B 5/08 | (2006.01) |
| F21K 99/00 | (2010.01) |
| C08L 77/00 | (2006.01) |
| F21S 8/10 | (2006.01) |
| C08K 3/00 | (2006.01) |
| C08K 3/22 | (2006.01) |
| C08K 3/26 | (2006.01) |
| C08K 3/34 | (2006.01) |
| C08K 7/14 | (2006.01) |
| H01L 33/60 | (2010.01) |
| F21V 7/22 | (2006.01) |

(52) U.S. Cl.
CPC ............. *F21K 9/50* (2013.01); *C08K 3/0033* (2013.01); *C08K 3/22* (2013.01); *C08K 3/26* (2013.01); *C08K 3/34* (2013.01); *C08K 7/14* (2013.01); *C08L 77/00* (2013.01); *F21S 48/1394* (2013.01); *F21S 48/238* (2013.01); *G02B 5/08* (2013.01); *C08K 2003/265* (2013.01); *C08K 2201/016* (2013.01); *F21V 7/22* (2013.01); *H01L 33/60* (2013.01)

(58) Field of Classification Search
CPC ............. C08K 2003/265; C08K 2003/2241; C08K 3/0033; F21K 9/50
USPC .............. 524/425, 497; 313/113; 362/341
See application file for complete search history.

(56) References Cited

U.S. PATENT DOCUMENTS

| | | | |
|---|---|---|---|
| 4,859,732 A * | 8/1989 | Minnick .................... 524/385 |
| 5,474,853 A | 12/1995 | Watanabe et al. |
| 2004/0034152 A1* | 2/2004 | Oka et al. .................. 524/497 |
| 2005/0131121 A1 | 6/2005 | Tsutsumi et al. |
| 2006/0263592 A1 | 11/2006 | Kusume et al. |
| 2007/0066736 A1 | 3/2007 | Tsutsumi et al. |
| 2007/0190346 A1* | 8/2007 | Ikegawa .................... 428/458 |
| 2009/0088507 A1* | 4/2009 | Ogasawara ............... 524/413 |
| 2011/0128743 A1* | 6/2011 | Matsumi et al. ......... 362/296.01 |
| 2011/0281990 A1* | 11/2011 | Lamberts et al. ........ 524/425 |

FOREIGN PATENT DOCUMENTS

| | | |
|---|---|---|
| CN | 1246386 | 3/2006 |
| EP | 1 405 879 A1 | 4/2004 |
| JP | 6-065500 A | 3/1994 |
| JP | 2007-271834 | 10/2007 |
| JP | 4117130 B2 | 7/2008 |
| JP | 2008-182172 A | 8/2008 |
| JP | 2009-507990 A | 2/2009 |

(Continued)

OTHER PUBLICATIONS

International Search Report (PCT/ISA/210) mailed on Aug. 7, 2012, by the Japanese Patent Office as the International Searching Authority for International Application No. PCT/JP2012/003724.

(Continued)

*Primary Examiner* — Randy Gulakowski
*Assistant Examiner* — Christopher M Rodd
(74) *Attorney, Agent, or Firm* — Buchanan, Ingersoll & Rooney PC (57) ABSTRACT

The purpose of the present invention is to provide a thermoplastic resin composition for a reflector plate with which it is possible to obtain a molded article having excellent moldability, high mechanical strength, excellent heat resistance and a high reflectance that is stable over time, and it is possible to obtain a reflector plate with which there is little reduction in reflectance due to heating. The thermoplastic resin composition for a reflector of the invention comprises 30 to 80 weight % of a thermoplastic resin (A) having structural units containing carbonyl groups and a melting point or glass transition temperature of 250° C. or higher, 10 to 50 weight % of an inorganic filler (B) containing an inorganic filler (B-1) that comprises a carbonyl structure and has an aspect ratio of 10 to 100, and 5 to 50 weight % of a white pigment (C).

8 Claims, 3 Drawing Sheets

(56) References Cited

FOREIGN PATENT DOCUMENTS

| | | |
|---|---|---|
| JP | 4245716 B2 | 4/2009 |
| TW | 200641049 | 12/2006 |
| WO | WO 00/46307 A1 | 8/2000 |
| WO | WO 03/022925 A1 | 3/2003 |
| WO | WO 2005/026241 A1 | 3/2005 |
| WO | WO 2006/112300 A1 | 10/2006 |
| WO | WO 2007/033129 A2 | 3/2007 |

OTHER PUBLICATIONS

Office Action issued in corresponding Taiwanese Application on Mar. 23, 2015 (6 pages).

Office Action issued in corresponding Korean Application on Apr. 13, 2015 (6 pages).

* cited by examiner

THERMOPLASTIC RESIN COMPOSITION FOR REFLECTOR, REFLECTOR PLATE, AND LIGHT-EMITTING DIODE ELEMENT

TECHNICAL FIELD

The present invention relates to a resin composition which is suitable for a reflection material and can be used even at high temperatures, and to a reflector plate to be obtained by molding the resin composition. More specifically, the present invention relates to a thermoplastic resin composition for a reflector which is suitable for insert molding and can provide a molded article excellent in mechanical properties, heat resistance, and light reflectance, and to a reflector plate.

BACKGROUND ART

A reflector plate is used in various situations in order to use light efficiently. In recent years, the switchover of a light source to a semiconductor-based one, that is, to a semiconductor laser or a light emitting diode (hereinafter referred to as LED) for the reduction in the size of an apparatus and a light source has been advancing. Therefore, the reflector plate is required to have not only mechanical strength, but also good heat resistance and precision moldability because it is, for example, surface-mounted on a printed-circuit board or the like. The reflector plate is also required to have stable high reflectance because of its function to reflect light, and in particular, it is necessary to suppress the reduction in reflectance due to heating in the steps of assembling LED and reflow soldering.

Further, cost reduction requirements for products have been increasing in recent years. The number of LED packages to be mounted on a finished product such as TV and a monitor is reduced, and the luminance is increased accompanying it. In addition, the reduction in the size of a product is also required. Therefore, cost reduction is achieved by increasing the number of obtainable parts in the production of LED packages by injection molding. In addition, there is required a molding material which not only offers improvement in reflectance but has high melt-flowability.

Glass fibers are generally used in wide applications as a reinforcing material (inorganic filler). However, for example, in the case of molding in which a large number of small molded articles are molded by one shot of injection molding from a molding material containing glass fibers, melt-flowability may tend to be insufficient. Further, a molded article of a molding material containing glass fibers may have a coarse gate cut surface, and since the area ratio which a gate cut surface occupies is relatively large particularly in a small-sized product, the coarse gate cut surface may significantly reduce product appearance. Therefore, an improvement in the melt-flowability of a molding material containing an inorganic filler is required.

Various improvements have been attempted in order to solve this problem. Examples of inorganic fillers particularly shown include Wollastonite (PTL 1), a potassium titanate-containing compound (PTL 2), and a combined use system of potassium titanate and titanium oxide (PTL 3).

However, there is concern that these techniques cause a reduction in reflectance and a reduction in mechanical strength due to the poor dispersion of an inorganic filler in a base polymer by using a plurality of inorganic fillers. Further, in order to disperse an inorganic filler in a base polymer, special screw configuration and temperature setting are used in melt mixing, which increases a load to the base polymer. This may pose the problem of causing a reduction in function due to the decomposition of the base polymer or easily leading to a cost increase.

On the other hand, a technique of suppressing a reduction in reflectance by the improvement of a base polymer is also shown (PTL 4). In many examples, a polyamide material is used for a reflector plate, but discoloration derived from a terminal amino group or an amide bond may occur, resulting in causing a reduction in reflectance. On the other hand, a heat-resistant polyester is attempted to be used instead of a polyamide resin. However, there is no disclosure with respect to the flowability of a resin composition containing a heat-resistant polyester as a base polymer and the mechanical strength of the molded article, and the performance balance as a reflection material is unknown.

CITATION LIST

Patent Literature

PTL 1: Japanese Patent No. 4245716
PTL 2: Japanese Patent No. 4117130
PTL 3: Japanese Patent Application Laid-Open No. 2008-182172
PTL 4: Japanese Translation of a PCT Application Laid-Open No. 2009-507990

SUMMARY OF INVENTION

Technical Problem

An object of the present invention is to provide a thermoplastic resin composition for a reflector which is excellent in moldability and can provide a molded article having high mechanical strength, excellent in heat resistance, and stably maintaining high reflectance over time. Another object of the present invention is to provide a thermoplastic resin composition for a reflector which can provide a molded article showing little reduction in reflectance due to heating in the steps of producing LED and reflow soldering.

Solution to Problem

As a result of intensive studies in view of such circumstances, the present inventors have found that the above problems can be solved by a resin composition including a thermoplastic resin (A) containing a carbonyl group, a specific inorganic filler (B-1) containing a carbonyl group, and a white pigment (C), and have completed the present invention.

[1] A thermoplastic resin composition for a reflector including 30 to 80% by weight of a thermoplastic resin (A) having a structural unit containing a carbonyl group and a melting point or glass transition temperature of 250° C. or more, 10 to 50% by weight of an inorganic filler (B) including an inorganic filler (B-1) containing a carbonyl structure in a molecule thereof and having an aspect ratio of 10 to 100, and 5 to 50% by weight of a white pigment (C), in which the total of the components (A), (B), and (C) is 100% by weight.

[2] The thermoplastic resin composition for the reflector according to [1], in which the thermoplastic resin (A) is a polyamide resin (A-1) containing: a dicarboxylic acid component unit (a-1) including 30 to 100 mol % of a terephthalic acid component unit, and 0 to 70 mol % of at least one of an aromatic dicarboxylic acid component unit other than terephthalic acid and a $C_{4-20}$ aliphatic dicarboxylic acid component unit, and a diamine component unit (a-2) including at least one of a $C_{4-20}$ linear aliphatic diamine component unit and a $C_{4-20}$ aliphatic diamine component unit having a side chain; or a polyester resin (A-2) containing: a dicarboxylic acid component unit (a-1) including 30 to 100 mol % of a terephthalic acid component unit and 0 to 70 mol % of at least one of an aromatic dicarboxylic acid component unit other than terephthalic acid and a $C_{4-20}$ aliphatic dicarboxylic acid component unit, and a $C_{4-20}$ alicyclic dialcohol component unit (a-3).

[3] The thermoplastic resin composition for the reflector according to [2], in which the diamine component unit (a-2) contained in the polyamide resin (A-1) is derived from 1,12-diaminododecane.

[4] The thermoplastic resin composition for the reflector according to [2], in which the dialcohol component unit (a-3) contained in the polyester resin (A-2) has a cyclohexane skeleton in a molecule thereof.

[5] The thermoplastic resin composition for the reflector according to [2], in which the polyamide resin (A-1) has an intrinsic viscosity [η] of 0.5 to 1.2 dl/g and a melting point of 270 to 350° C.

[6] The thermoplastic resin composition for the reflector according to any one of [1] to [5], in which the inorganic filler (B-1) is a calcium carbonate whisker.

[7] The thermoplastic resin composition for the reflector according to any one of [1] to [6], in which the inorganic filler (B) includes two or more inorganic fillers having different aspect ratios and average lengths.

[8] The thermoplastic resin composition for the reflector according to any one of [1] to [7], in which the inorganic filler (B) further includes an inorganic filler (B-2) having an aspect ratio and average length different from those of the inorganic filler (B-1).

[9] The thermoplastic resin composition for the reflector according to [8], in which the aspect ratio and average length of the inorganic filler (B-2) are larger than the aspect ratio and average length of the inorganic filler (B-1), and the ratio by weight of the content of the inorganic filler (B-1) to the content of the inorganic filler (B-2) is inorganic filler (B-1)/inorganic filler (B-2)=15/85 to 70/30.

[10] The thermoplastic resin composition for the reflector according to any one of [1] to [9], in which the white pigment (C) is titanium oxide.

[11] A reflector plate to be obtained by molding the thermoplastic resin composition according to any one of [1] to [10].

[12] The reflector plate according to [11], in which the reflector plate is for a light emitting diode element.

[13] A light emitting diode element containing the reflector plate according to [11] or [12].

Advantageous Effects of Invention

The thermoplastic resin composition for a reflector of the present invention is excellent in flowability and moldability, and the reflector plate to be obtained by molding the resin composition has high mechanical strength and high heat resistance. Further, the reflector plate to be obtained has little reduction in reflectance with time and little reduction in reflectance due to heating in the steps of producing LED and reflow soldering. Therefore, the industrial value of the present invention is extremely high.

DESCRIPTION OF EMBODIMENTS

1. Thermoplastic Resin Composition

Hereinafter, the present invention will be described in detail. The thermoplastic resin composition of the present invention includes a thermoplastic resin (A), an inorganic filler (B), and a white pigment (C) to be described below. The thermoplastic resin composition of the present invention is preferably used for a reflector.

[Thermoplastic Resin A]

The thermoplastic resin (A) of the present invention is characterized by having a structural unit containing a carbonyl group and having a melting point or glass transition temperature of 250° C. or more. From the point of view of heat resistance and strength, engineering plastics and super engineering plastics are preferred. Examples of the thermoplastic resin (A) include polyamide, polyester, a liquid crystal polymer, and polyether ether ketones. Examples particularly include a polyamide resin, a polyester resin, and a polyimide resin containing an aromatic polyfunctional carboxylic acid structural unit in terms of the compatibility with injection molding and extrusion molding.

The melting point (Tm) measured with a differential scanning calorimeter (DSC) of the thermoplastic resin (A) is 250° C. or more, preferably 270 to 350° C., and more preferably 290 to 335° C. When the melting point is 250° C. or more, the deformation of the reflector plate during reflow soldering is suppressed. Although the upper limit temperature is not limited in principle, a melting point of 350° C. or less is preferred because it can suppress the decomposition of a resin during melt molding.

The content of the thermoplastic resin (A) is preferably 30 to 80% by weight, more preferably 40 to 75% by weight, and further preferably 45 to 70% by weight, relative to the total amount of the thermoplastic resin (A), the inorganic filler (B), and the white pigment (C). Further, it is one of the preferred embodiments that the content of the thermoplastic resin (A) is 30 to 80% by weight relative to the total amount of the thermoplastic resin (A), the inorganic filler (B-1), and the white pigment (C), and the content is more preferably 40 to 75% by weight and further preferably 45 to 70% by weight. When the content of the thermoplastic resin (A) is in the above range, a molded article excellent in heat resistance that can endure the reflow soldering step can be obtained without impairing the moldability of the thermoplastic resin composition.

The thermoplastic resin (A) of the present invention preferably includes a polyamide resin (A-1) or a polyester resin (A-2).

[Polyamide Resin (A-1)]

The polyamide resin (A-1) used in the present invention is characterized by containing a dicarboxylic acid component unit (a-1) and a diamine component unit (a-2).

[Dicarboxylic Acid Component Unit (A-1)]

The dicarboxylic acid component unit (a-1) constituting the polyamide resin (A-1) used in the present invention preferably includes 30 to 100 mol % of a terephthalic acid component unit, and 0 to 70 mol % of at least one of an aromatic dicarboxylic acid component unit other than terephthalic acid and a $C_{4-20}$ aliphatic dicarboxylic acid component unit. The total amount of these dicarboxylic acid component units (a-1) is 100 mol %.

Among these, the aromatic dicarboxylic acid component unit other than terephthalic acid is preferably derived, for example, from isophthalic acid, 2-methylterephthalic acid, naphthalene dicarboxylic acid, and a combination thereof. Further, the number of carbon atoms of the aliphatic dicarboxylic acid component unit is not particularly limited, but this unit is preferably derived from a $C_{4-20}$ aliphatic dicarboxylic acid, preferably a $C_{6-12}$ aliphatic dicarboxylic acid. Examples of the aliphatic dicarboxylic acid constituting the aliphatic dicarboxylic acid component unit include adipic acid, suberic acid, azelaic acid, sebacic acid, decane dicarboxylic acid, undecane dicarboxylic acid, and dodecane dicarboxylic acid. Among these, adipic acid is particularly preferred.

Further, the content of the terephthalic acid component unit with respect to the dicarboxylic acid component unit is 30 to 100 mol %, preferably 40 to 100 mol %, and further preferably 40 to 80 mol %. The content of the aromatic dicarboxylic acid component unit other than terephthalic acid is 0 to 70 mol %, preferably 0 to 60 mol %, and further preferably 20 to 60 mol % with respect to the dicarboxylic acid component unit. The content of the $C_{4-20}$ aliphatic dicarboxylic acid component unit, preferably the $C_{6-12}$ aliphatic dicarboxylic acid component unit is 0 to 70 mol %, preferably 0 to 60 mol %, and further preferably 20 to 60 mol % with respect to the dicarboxylic acid component unit.

Further, in the present invention, the dicarboxylic acid component unit (a-1) may include a small amount, for example about 10 mol % or less, of a polyvalent carboxylic acid component unit in addition to the structural units as described above. Specific examples of the polyvalent carboxylic acid constituting such a polyvalent carboxylic acid component unit include a tribasic acid and a polybasic acid, such as trimellitic acid and pyromellitic acid.

[Diamine Component Unit (A-2)]

The diamine component unit (a-2) constituting the polyamide resin (A-1) used in the present invention is preferably a $C_{4-20}$ linear aliphatic diamine, preferably a $C_{6-12}$ linear aliphatic diamine, and/or a $C_{4-20}$ aliphatic diamine having a side chain, preferably a $C_{6-12}$ aliphatic diamine having a side chain, and the total amount of these diamine component units (a-2) is 100 mol %.

The linear aliphatic diamine component unit can be derived, for example, from 1,4-diaminobutane, 1,6-diaminohexane, 1,7-diaminoheptane, 1,8-diaminooctane, 1,9-diaminononane, 1,10-diaminodecane, 1,11-diaminoundecane, and 1,12-diaminododecane. Among these; a component unit derived from 1,6-diaminohexane, 1,9-diaminononane, or 1,12-diaminododecane is preferred, and a component unit derived from 1,12-diaminododecane is particularly preferred.

Further, the linear aliphatic diamine component unit having a side chain can be derived, for example, from 2-methyl-1,5-diaminopentane, 2-methyl-1,6-diaminohexane, 2-methyl-1,7-diaminoheptane, 2-methyl-1,8-diaminooctane, 2-methyl-1,9-diaminononane, 2-methyl-1,10-diaminodecane, and 2-methyl-1,11-diaminoundecane. Among these, component units derived from 2-methyl-1,7-diaminoheptane, 2-methyl-1,8-diaminooctane, 2-methyl-1,9-diaminononane, and 2-methyl-1,11-diaminoundecane are preferred.

The polyamide resin (A-1) used in the present invention can be produced by a known method. For example, it can be produced by the polycondensation of a dicarboxylic acid component unit (a-1) and a diamine component unit (a-2) in a homogeneous solution. More specifically, the above dicarboxylic acid component and diamine component are heated in the presence of a catalyst in the manner as described in International Publication No. 03/085029 to obtain a low-order condensate, and then a shear stress can be applied to a melt of the low-order condensate to polycondensate it to produce the polyamide resin.

In the polyamide resin (A-1) used in the present invention, a preferred lower limit of the concentration of a terminal amino group is 40 mmol/kg, and a preferred upper limit thereof is 300 mmol/kg. The range between the lower limit and the upper limit is more preferably 70 to 230 mmol/kg, further preferably 80 to 210 mmol/kg, and particularly preferably 80 to 190 mmol/kg. When the concentration of the terminal amino group is in the above range, there is a tendency that the reduction in reflectance due to heating, for example, in the steps of producing LED, reflow soldering, and the like can be effectively suppressed, and the concentration of the terminal amino group in the above range is also preferred in terms of balance with the mechanical strength of the polyamide resin.

Here, the concentration of the terminal amino group is determined as follows. In a tall beaker is precisely weighed 0.5 to 0.7 g of a polyamide resin as a sample, and thereto is added 30 ml of m-cresol. The mixture is blanketed with nitrogen and then hermetically sealed, which is then stirred at 110° C. for 30 minutes to dissolve the polyamide resin. Next, the resulting solution is cooled to room temperature, and thereto is added 2 to 3 drops of a 0.1% thymol blue/m-cresol solution as an indicator. Next, the resulting mixture is titrated with 0.02 M of p-toluenesulfonic acid/m-cresol until the color changes from yellow to violet, and the concentration of the terminal amino group is calculated from the following expression (1). Note that in the blank test, the above operation is performed without adding a sample.

Concentration of terminal amino group (mmol/kg)=
$(A-B) \times F \times M \times 10^3 /S$ (1)

A: Titre (ml) of p-toluenesulfonic acid solution required for sample,

B: Titre (ml) of p-toluenesulfonic acid solution required for the blank test,

F: The factor of p-toluenesulfonic acid solution,

M: Molar concentration (M) of p-toluenesulfonic acid solution, and

S: Sample weight.

The concentration of the terminal amino group of the polyamide resin (A-1) can be controlled by a monomer ratio and a molecular weight modifier used in the polycondensation. In order to bring the concentration of the terminal amino group of the polyamide resin (A-1) into the above range, a preferred example is a method in which the total number of moles of the charged diamine component unit (a-2) is set so as to be larger than the total number of moles of the charged dicarboxylic acid component unit (a-1) in the polycondensation. Particularly, in the present invention, when the dicarboxylic acid component unit (a-1) and the diamine component unit (a-2) are subjected to polycondensation, a target concentration of the terminal amino group can be obtained by controlling the amount of these component units so that the value of [the total number of moles of the charged diamine component unit (a-2)/the total number of moles of the charged dicarboxylic acid component unit (a-1)] may be 1.01 to 1.2, preferably 1.02 to 1.15, and further preferably 1.02 to 1.1.

Further, for example when the concentration of the terminal amino group of the polyamide resin (A-1) is too high, the terminal amino group of a part of the polyamide resin may be sealed, for example, with a molecular weight modifier such as monocarboxylic acid.

Further, the polyamide resin (A-1) used in the present invention has an intrinsic viscosity [η] measured in 96.5% sulfuric acid at a temperature of 25° C. of 0.5 to 1.2 dl/g, preferably 0.6 to 1.0 dl/g, and further preferably 0.7 to 0.9 dl/g. When the intrinsic viscosity [η] is in such a range, the flowability during the molding of the resin composition is improved, and the mechanical properties of the molded article to be obtained is also good. When the intrinsic viscosity is 0.5 dl/g or more, a molded article having sufficient mechanical strength can be obtained. Further, when the intrinsic viscosity is 1.2 dl/g or less, a resin composition having good flowability during the molding can be obtained. In order to control the intrinsic viscosity [η] of the polyamide resin (A-1) within the above range, it is preferred, for example, to blend a molecular weight modifier or the like in the reaction system to allow the dicarboxylic acid component unit (a-1) and the diamine component unit (a-2) to react with each other. Monocarboxylic acids and monoamines can be used as a molecular weight modifier.

Examples of the monocarboxylic acids used here include $C_{2-30}$ aliphatic monocarboxylic acids, $C_{2-30}$ aromatic monocarboxylic acids, and $C_{2-30}$ alicyclic monocarboxylic acids. Note that the aromatic monocarboxylic acids and alicyclic monocarboxylic acids may have a substituent bonded to the cyclic structure part. Examples of the aliphatic monocarboxylic acids include acetic acid, propionic acid, butyric acid, valeric acid, caproic acid, caprylic acid, lauric acid, tridecyl acid, myristic acid, palmitic acid, stearic acid, oleic acid, and linoleic acid. Further, examples of the aromatic monocarboxylic acids include benzoic acid, toluic acid, naphthalene carboxylic acid, methylnaphthalene carboxylic acid, and phenylacetic acid, and examples of the alicyclic monocarboxylic acids include cyclohexane carboxylic acid.

Such a molecular weight modifier is used in the reaction of the dicarboxylic acid component unit (a-1) with the diamine component unit (a-2) as described above, and is preferably used in an amount of generally 0 to 0.07 mol, preferably 0 to 0.05 mol relative to 1 mol of the total amount of the dicarboxylic acid component units (a-1) in the reaction system. When the molecular weight modifier is used in such an amount, at least a part thereof is incorporated into the polyamide resin, and, thereby, the molecular weight, that is, intrinsic viscosity [η], of the polyamide resin (A-1) is controlled within a preferred range.

The melting point (Tm) measured with a differential scanning calorimeter (DSC) of the polyamide resin (A-1) used in the present invention is 250° C. or more. The melting point is preferably in the range where the lower limit and upper limit are 270° C. and 350° C., respectively, and is particularly preferably in the range of from 290 to 335° C. When the melting point is 250° C. or more, the deformation of the reflector plate during reflow soldering is suppressed. Although the upper limit temperature is not limited in principle, a melting point of 350° C. or less is preferred because it can suppress the decomposition of a resin during melt molding.

[Polyester Resin (A-2)]

The polyester resin (A-2) used in the present invention has a dicarboxylic acid component unit (a-1) and a dialcohol component unit (a-3).

Examples of the dicarboxylic acid component unit (a-1) include the same one as the above dicarboxylic acid component unit (a-1). The dicarboxylic acid component unit (a-1) preferably includes a terephthalic acid component unit or an aromatic dicarboxylic acid component unit other than terephthalic acid.

The dicarboxylic acid component unit (a-1) may further include an aliphatic dicarboxylic acid component unit such as adipic acid, sebacic acid, azelaic acid, and decane dicarboxylic acid and an alicyclic dicarboxylic acid component unit such as cyclohexanedicarboxylic acid, in addition to the terephthalic acid component unit and aromatic dicarboxylic acid component unit.

The dialcohol component unit (a-3) preferably includes a dialcohol component unit having a cyclic skeleton. The dialcohol component unit having a cyclic skeleton may be an alicyclic dialcohol component unit having an alicyclic skeleton or an aromatic dialcohol component unit.

The alicyclic dialcohol component unit is preferably a $C_{4-20}$ alicyclic dialcohol component unit, and is more preferably derived from an alicyclic dialcohol having a cyclohexane skeleton such as 1,4-cyclohexanediol and 1,4-cyclohexanedimethanol.

The alicyclic dialcohol includes isomers having a cis- or trans-configuration, and the trans configuration is preferred from the point of view of the heat resistance of a molded article. Therefore, the cis/trans ratio is preferably from 30/70 to 0/100, more preferably from 50/50 to 0/100.

The aromatic dialcohol component unit is preferably derived from an aromatic diol such as bisphenol, hydroquinone, and 2,2-bis(4-β-hydroxyethoxy phenyl)propane. The dialcohol component unit having a cyclic skeleton preferably includes an alicyclic dialcohol component unit from the point of view of moldability and the heat resistance of a molded article.

The dialcohol component unit may further include an aliphatic dialcohol component unit other than the above dialcohol component unit having a cyclic skeleton for the purpose of increasing the melt-flowability as a resin and the like. The aliphatic dialcohol component unit may be derived, for example, from ethylene glycol, trimethylene glycol, propylene glycol, tetramethylene glycol, neopentyl glycol, hexamethylene glycol, and dodecamethylene glycol.

The melting point (Tm) or glass transition temperature (Tg) measured with a differential scanning calorimeter (DSC) of the polyester resin (A-2) used in the present invention is 250° C. or more. The melting point or glass transition temperature is preferably in the range where the lower limit and upper limit are 270° C. and 350° C., respectively, and is particularly preferably in the range of from 290 to 335° C. When these temperatures are 250° C. or more, the deformation of the reflector plate during reflow soldering is suppressed. Although the upper limit temperature is not limited in principle, a melting point or glass transition temperature of 350° C. or less is preferred because it can suppress the decomposition of a polyester resin during melt molding.

In the present invention, the plurality of thermoplastic resins each having a carbonyl group may be used in combination, if needed.

[Inorganic Filler (B)]

The inorganic filler (B) used in the present invention is characterized by including at least an inorganic filler (B-1) having a carbonyl group in a molecule thereof and a specific aspect ratio.

The content of the inorganic filler (B) is preferably 10 to 50% by weight, more preferably 10 to 40% by weight, and further preferably 10 to 30% by weight relative to 100% by weight of the total amount of the thermoplastic resin (A), the inorganic filler (B) and the white pigment (C). An embodiment in which all of the inorganic fillers (B) are composed of the inorganic filler (B-1) is also one of the preferred examples. That is, the content of the inorganic filler (B-1) is preferably 10 to 50% by weight, more preferably 10 to 40% by weight, and further preferably 10 to 30% by weight relative to 100% by weight of the total amount of the thermoplastic resin (A), the inorganic filler (B-1) and the white pigment (C).

When the content of the inorganic filler (B) is 10% by weight or more, a molded article will not be deformed during injection molding and in the reflow soldering step, and there is a tendency that the stability with time of reflectance is excellent. Further, when the content is 50% by weight or less, a molded article having good moldability and appearance can be obtained.

The strength of a thermoplastic resin (A) can be improved by using such an inorganic filler (B-1) in combination with the thermoplastic resin (A) such as the polyamide resin (A-1) or polyester resin (A-2).

In the present invention, a combination of the thermoplastic resin (A) having a carbonyl group in a molecule thereof and an inorganic filler (B-1) having a carbonyl group in a molecule thereof is one of the features. This combination has probably improved the compatibility of the thermoplastic resin (A) as a base polymer with the inorganic filler (B-1) and the dispersibility of the inorganic filler (B-1) in the base polymer. It is estimated that these improvements will lead to the improvement of the heat resistance, mechanical strength, and the like of a molded article to be obtained. Further, it is estimated that the improvement in the compatibility of the thermoplastic resin (A) which is a base polymer with the inorganic filler (B-1) also improves the dispersibility of a white pigment (C) to be described below and the reflectance of a molded article to be obtained.

It is one of the requirements that the inorganic filler (B-1) is an inorganic filler having a carbonyl group in a molecule thereof. Further, the inorganic filler (B-1) preferably has weak basicity. The present inventors believe that the change with time of the reflectance of a cured product can be suppressed because the inorganic filler (B-1) having weak basicity has interaction with a carboxyl group at a molecular terminal of the polyamide resin (A-1) to suppress the discoloration of a resin by the reaction of the carboxyl group. In particular, it is estimated that since the inorganic filler (B-1) having an aspect ratio to be described below has a relatively high surface area, it not only has the effect of increasing the mechanical strength of a molded article but also has a high effect of suppressing the above chemical discoloration. Specific examples of the inorganic filler (B-1) include a whisker of carbonate such as calcium carbonate, and hydrotalcite.

Specifically, the inorganic filler (B-1) may be fibrous, powdery, granular, tabular, needlelike, cloth-like, mat-like, and the like. The aspect ratio (L (average length of fibers)/D (average outside diameter of fibers)) of the inorganic filler (B-1) may be 10 to 100, preferably 10 to 70. The average length of the inorganic filler (B-1) may be 10 to 100 μm, preferably 10 to 50 μm. It is preferred to use an inorganic filler (B-1) having an aspect ratio and average length within these ranges.

As described above, when all of the inorganic fillers (B) is composed of the inorganic filler (B-1), the content of the inorganic filler (B-1) is preferably 10 to 50% by weight relative to 100% by weight of the total amount of the thermoplastic resin (A), the inorganic filler (B-1) and the white pigment (C). On the other hand, when the inorganic filler (B) further includes an inorganic filler other than the inorganic filler (B-1), the content of the inorganic filler (B-1) is preferably 1.5 to 35% by weight, more preferably 5 to 35% by weight, and further preferably 5 to 30% by weight relative to 100% by weight of the total amount of the thermoplastic resin (A), the inorganic filler (B-1) and the white pigment (C). When the content of the inorganic filler (B-1) is 10% by weight or more, a molded article will not be deformed during injection molding and in the reflow soldering step, and there is a tendency that the stability with time of reflectance is excellent. Further, when the content is 50% by weight or less, a molded article having good moldability and appearance can be obtained.

Further, the lower limit of the content of the inorganic filler (B-1) is preferably 3% by weight, more preferably 5% by weight, relative to the thermoplastic resin (A). On the other hand, the upper limit is preferably 130% by weight, more preferably 50% by weight, further preferably 45% by weight, particularly preferably 40% by weight, and especially preferably 35% by weight.

The inorganic filler (B-1) may be one inorganic filler or may be a combination of two or more inorganic fillers having different aspect ratios and/or average lengths (preferably aspect ratios and average lengths).

As described above, since the dispersibility of the inorganic filler (B-1) in the thermoplastic resin (A) having a carbonyl group is high, it is possible to increase the heat resistance, mechanical strength, and the like of a molded article. Further, since the dispersibility of the inorganic filler (B-1) in the thermoplastic resin (A) is increased, the dispersibility of the white pigment (C) will also be improved to increase the reflectance of the molded article.

Further, since the inorganic filler (B-1) having a carbonyl group in a molecule thereof is easily dispersed in the thermoplastic resin (A), it does not necessarily require a pretreatment known for glass fibers or the like. In this case, even when a molded article is subjected to heat treatment, a reduction in reflectance may be suppressed, which reduction is caused by decomposition of the thermoplastic resin (A) or the like, the decomposition being caused by residual pretreatment agent which had not reacted with the inorganic filler or pretreatment agent resulting from the inorganic filler.

The inorganic filler (B) may further include another inorganic filler (B-2) in addition to the above inorganic filler (B-1) if needed. For example, it is also possible to combine the inorganic filler (B-1) with another inorganic filler (B-2) having an aspect ratio and/or average length different from those of the inorganic filler (B-1).

Thus, when a resin composition containing two or more inorganic fillers having different aspect ratios and/or average lengths is injection molded, it may be surprisingly possible to greatly improve not only the shrinkage percentage in the MD direction of the molded article to be obtained but also various physical properties such as shrinkage percentage in the TD direction. The reason why such an effect is developed is uncertain, but it is probably derived from the following phenomena.

When a resin composition containing an inorganic filler is subjected to thermoforming, it is well-known that the inorganic filler tends to be oriented in the machine direction (MD direction). In particular, an inorganic filler with a large aspect ratio tends to be oriented. Therefore, when an inorganic filler with a large aspect ratio is used, the shrinkage percentage in the MD direction of a molded article or the like can be effectively reduced.

When an inorganic filler with a small aspect ratio and a small average length (inorganic filler β) coexists with an inorganic filler with a large aspect ratio and a large average length (inorganic filler α), the inorganic filler α tends to be oriented in the MD direction, but at least a part of the inorganic filler β will be oriented in the TD direction in a relatively high proportion influenced by the turbulence of flow caused by the inorganic filler α, thereby causing disorder in the orientation in the MD direction. As a result, the molded article to be obtained will tend to have a reduced shrinkage percentage not only in the MD direction but in the TD direction. At this time, the coexistence of the inorganic filler α will allow the inorganic filler β to be more easily cracked or cut, allowing it to be easily oriented in the TD direction.

The ratio of the inorganic filler β with a small aspect ratio and a small average length to the inorganic filler α with a large aspect ratio and a large average length, inorganic filler β/inorganic filler α, by weight, is preferably 15/85 to 70/30, more preferably 25/75 to 70/30, further preferably 25/75 to 65/35, and particularly preferably 25/75 to 60/40. If the proportion of the inorganic filler α with a large aspect ratio and average length is too high, the shrinkage percentage in the MD direction will be sufficiently reduced, but the shrinkage percentage in the TD direction does not tend to be reduced because the proportion of the inorganic filler β is too low. This will probably generate the difference between the shrinkage percentage in the MD direction and the shrinkage percentage in the TD direction of a molded article. On the other hand, if the proportion of the inorganic filler α is too low, the inorganic filler α will probably not tend to be sufficiently oriented in the MD direction, preventing the shrinkage percentage in the MD direction from being sufficiently reduced.

In the present invention, when the inorganic filler α and the inorganic filler β are used in combination, at least one of the inorganic filler α and the inorganic filler β may be the inorganic filler (B-1) as described above; it is preferred that the inorganic filler α be another inorganic filler (B-2), and the inorganic filler β be the inorganic filler (B-1). The inorganic filler (B-2) preferably has at least a larger aspect ratio, more preferably has both a larger aspect ratio and a larger average length, than the inorganic filler (B-1).

Specific examples of another inorganic filler (B-2) include glass fibers, silicate such as Wollastonite (calcium silicate), and titanate such as a potassium titanate whisker. Among these, glass fibers are preferred.

The lower limit of the aspect ratio of another inorganic filler (B-2) is preferably 20, more preferably 50, and further preferably 90. On the other hand, the upper limit of the aspect ratio of the inorganic filler (B-2) is preferably 500, more preferably 400, and further preferably 350. In order to effectively reduce the shrinkage percentage of a molded article, the ratio of the aspect ratio of another inorganic filler (B-2) to the aspect ratio of the inorganic filler (B-1) is preferably 2 or more, more preferably 5 or more. The upper limit of the above ratio may be suitably selected, but it may be preferably about 20.

The lower limit of the average length of another inorganic filler (B-2) is preferably 15 μm, more preferably 30 μm, further preferably 50 μm. On the other hand, the upper limit of the average length of the inorganic filler (B-2) is preferably 8 mm, more preferably 6 mm, and further preferably 5 mm. In order to effectively reduce the shrinkage percentage of a molded article, the ratio of the average length of another inorganic filler (B-2) to the average length of the inorganic filler (B-1) is preferably 10 or more, more preferably 30 or more. The upper limit of the above ratio may be about 300.

Thus, when the inorganic filler (B-1) is used alone, the shrinkage percentage of a molded article can be sometimes relatively high. On the other hand, the shrinkage percentage of a molded article to be obtained can be reduced by using the inorganic filler (B-1) and another inorganic filler (B-2) with a larger aspect ratio and average length than the former in combination. Further, the shrinkage percentage of a molded article can be reduced with good balance not only in the MD direction but in the TD direction by adjusting the content ratio of the inorganic filler (B-1) and another inorganic filler (B-2) into the above range.

When another inorganic filler (B-2) is used, the lower limit of the total content of the inorganic filler (B-1) and another inorganic filler (B-2) is preferably 15% by weight, more preferably 25% by weight relative to the thermoplastic resin (A). On the other hand, the upper limit is preferably 130% by weight, more preferably 70% by weight, further preferably 60% by weight, particularly preferably 55% by weight, and especially preferably 50% by weight. If the total content of the inorganic fillers is too low, there is a tendency that a molded article is easily deformed, for example, expanded with heat. On the other hand, if it is too high, there may be a negative effect of poor appearance, reduction in moldability, and the like due to the reduction in dispersibility of the fillers in the resin composition, and the like.

[White Pigment (C)]

The white pigment (C) used in the present invention may be any white pigment which is used in combination with the thermoplastic resin (A) such as polyamide resin (A-1) and polyester resin (A-2) and which whitens these resins to thereby improve the light reflection function thereof. Specific examples of the white pigment (C) include titanium oxide, zinc oxide, zinc sulfide, lead white, zinc sulfate, barium sulfate, calcium carbonate, and alumina. These white pigments may be used alone or in combination of two or more.

These white pigments (C) may also be used treated with a silane coupling agent or a titanium coupling agent or the like. For example, the white pigment (C) may be surface-treated with a silane-based compound such as vinyltriethoxysilane, 2-aminopropyltriethoxysilane, and 2-glycidoxypropyltriethoxysilane. The white pigment (C) is particularly preferably titanium oxide. Optical characteristics such as reflectance and light-blocking properties are improved by using titanium oxide.

The rutile type of titanium oxide is preferred. The particle size of titanium oxide is 0.1 to 0.5 μm, preferably 0.15 to 0.3 μm.

These white pigments (C) preferably have a small aspect ratio, that is, a generally spherical shape for the purpose of obtaining uniform reflectance or the like.

The white pigment (C) may preferably be contained in a proportion of 5 to 50% by weight, preferably 10 to 40% by weight, and further preferably 10 to 30% by weight to 100% by weight of the total amount of the thermoplastic resin (A), the inorganic filler (B) and the white pigment (C).

Further, it is also one of the preferred embodiments to add the white pigment (C) in a proportion of 5 to 50% by weight, preferably 10 to 40% by weight, and further preferably 10 to 30% by weight to 100% by weight of the total amount of the thermoplastic resin (A), the inorganic filler (B-1) and the white pigment (C). When the content of the white pigment (C) is 5% by weight or more, sufficient light reflection properties such as reflectance can be obtained. Further, the content is preferably 50% by weight or less because the moldability will not be impaired.

Further, the lower limit of the content of the white pigment (C) is preferably 20% by weight, more preferably 30% by weight relative to the thermoplastic resin (A). On the other hand, the upper limit is preferably 130% by weight, more preferably 75% by weight, and further preferably 65% by weight.

[Other Additives]

In the present invention, the following additives may be added depending on applications as long as the effect of the present invention is not impaired: antioxidants (such as phenols, amines, sulfur antioxidants, and phosphorus antioxidants), heat-resistant stabilizers (such as lactone compounds, vitamin Es, hydroquinones, copper halide, and iodine compounds), light stabilizers (such as benzotriazoles, triazines, benzophenones, benzoates, hindered amines, and oxanilides), other polymers (olefins, modified polyolefins, ethylene-propylene copolymers, olefin copolymers such as an ethylene-1-butene copolymer, olefin copolymers such as a propylene-1-butene copolymer, polystyrene, polyamide, polycarbonate, polyacetal, polysulfone, polyphenylene oxide, fluororesins, silicone resins, LCP, and the like), flame retardants (such as bromine-based, chlorine-based, phosphorus-based, antimony-based, and inorganic flame retardants), fluorescent brightening agents, plasticizers, thickeners, antistatic agents, release agents, pigments, crystal nucleating agents, and various known compounding agents.

The thermoplastic resin composition of the present invention can be produced by a known method, for example, a method of mixing the above components with a Henschel mixer, a V-blender, a ribbon blender, a tumbler blender, or the like, or a method in which after the mixing, the mixture is further melt kneaded with a single screw extruder, a multi-screw extruder, a kneader, a Banbury mixer, or the like and then granulated or ground.

The thermoplastic resin composition of the present invention has high mechanical strength, heat resistance, and reflectance, and can be suitably used for the application of a reflector (preferably reflector plate).

[Reflector Plate, Reflector Plate for Light-Emitting Diode Element]

The reflector plate may be a casing, a housing, or the like which may or may not have an open surface at least in the direction to emit light. Specifically, the shape of the reflector plate may be box-shaped, case-shaped, funnel-shaped, bowl-shaped, parabola-shaped, cylindrical, conical, honeycomb-shaped, and plate-shaped (where the plate has a planar, spherical, or curved light reflection surface). It is preferred that the reflector plate be particularly a reflector plate for light emitting diode (LED) elements.

The reflector plate is generally obtained by shaping the thermoplastic resin composition of the present invention to a desired shape by thermoforming such as injection molding, particularly insert molding using metal as an insert article (such as hoop molding), melt molding, extrusion molding, inflation molding, and blow molding. A light-emitting diode element having a reflector plate can be obtained by mounting, for example, a LED element and other parts to the obtained reflector plate, followed by sealing with a sealing resin, joining, bonding, and the like.

Further, the thermoplastic resin composition and reflector plate of the present invention can be applied not only to the LED application but to other applications for reflecting light. As specific examples, the reflector plate of the present invention can be used as a reflector plate for light-emitting devices, such as various electric electronic components, interior illumination, ceiling illumination, exterior illumination, automobile illumination, display equipment, and headlights.

EXAMPLES

[Flexural Test (Toughness)]

A resin composition was molded under the following molding conditions using the following injection molding machine to obtain a test piece of 64 mm in length, 6 mm in width, and 0.8 mm in thickness.

Molding machine: Sodick Plustech Co., Ltd., Tuparl TR40S3A

Molding machine cylinder temperature: melting point (Tm)+10° C., mold temperature: 120° C.

The obtained test piece was allowed to stand at a temperature of 23° C. in a nitrogen atmosphere for 24 hours. Next, the resulting test piece was subjected to flexural test under the conditions of a span of 26 mm and a flexural rate of 5 mm/min using a flexural test machine AB5 manufactured by NTESCO in an atmosphere of a temperature of 23° C. and a relative humidity of 50% to measure flexural strength, the amount of deformation, elastic modulus, and energy (toughness) required for breaking the test piece.

[Reflow Heat Resistance]

A resin composition was molded under the following molding conditions using the following injection molding machine to obtain a test piece of 64 mm in length, 6 mm in width, and 0.8 mm in thickness.

Molding machine: Sodick Plustech Co., Ltd., Tuparl TR40S3A

Molding machine cylinder temperature: melting point (Tm)+10° C., mold temperature: 120° C.

The obtained test piece was humidity-conditioned at a temperature of 40° C. and a relative humidity of 95% for 96 hours. Next, the resulting test piece was subjected to a reflow step according to a temperature profile shown in FIG. 1 using an air reflow soldering apparatus (AIS-20-82-C manufactured by Eightech Tectron Co., Ltd.).

Figure 1:
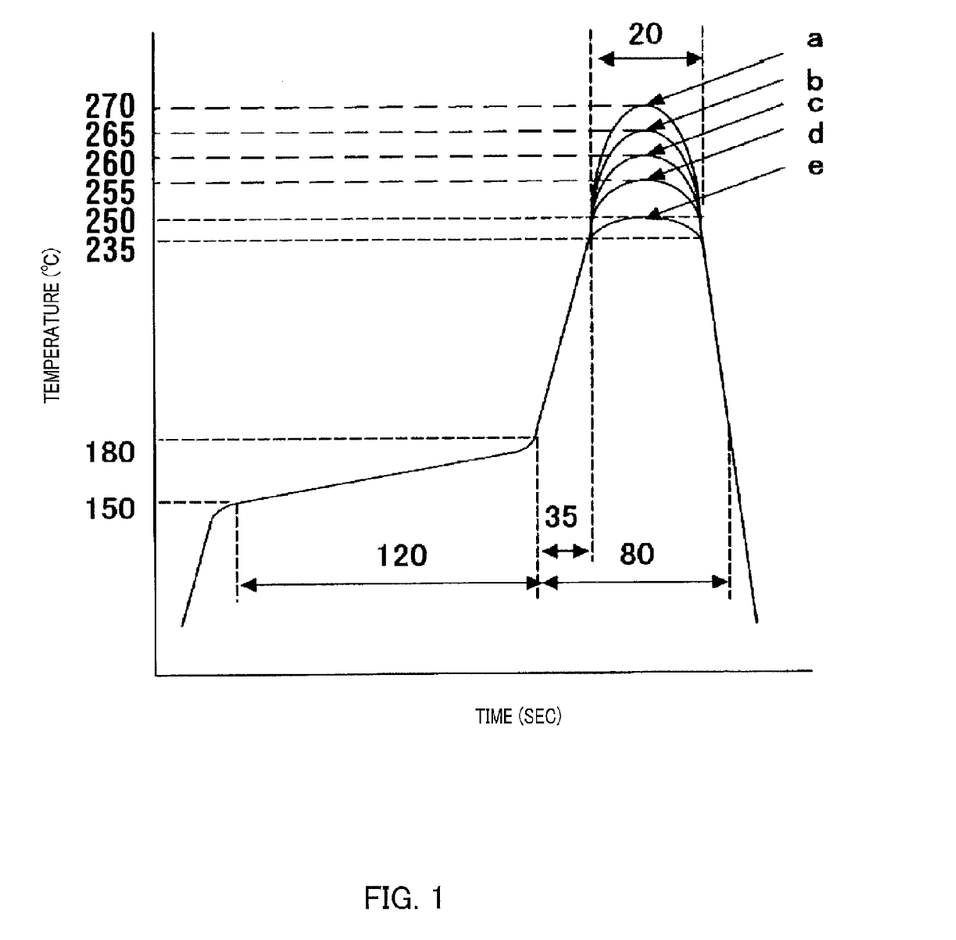
FIG. 1 illustrates the temperature profile of the reflow step for evaluating the reflow heat resistance in Examples.

Specifically the above humidity-conditioned test piece was placed on a glass epoxy substrate having a thickness of 1 mm, and a temperature sensor was installed on the substrate to measure a temperature profile. In FIG. 1, the temperature of the test piece was raised to 230° C. at a predetermined rate. Next, the temperature of the test piece was raised to a predetermined temperature (a: 270° C., b: 265° C., c: 260° C., d: 255° C., e: 250° C.) in 20 seconds by heating, and then the temperature was lowered to 230° C. The maximum value of preset temperatures at which the test piece is not melted and no blister occurs on the surface of the test piece was determined, and this maximum value of preset temperatures was defined as a reflow heat-resistant temperature.

Generally, the reflow heat-resistant temperature of a test piece absorbing moisture tends to be low as compared with that of a test piece in an absolute dry state.

[Intrinsic Viscosity [η]]

In 50 ml of a 96.5% sulfuric acid solution, 0.5 g of a polyamide resin was dissolved. The falling time (sec) of the resulting solution was measured using an Ubbelohde viscometer under a condition of 25° C.±0.05° C., and the intrinsic viscosity was calculated from the following expression (2).

$$[\eta] = \eta SP/[C(1+0.205\eta SP)] \quad (2)$$

[η]: intrinsic viscosity (dl/g)

ηSP: specific viscosity

C: sample concentration (g/dl)

t: falling time (sec) of sample solution t0: falling time (sec) of blank sulfuric acid $$\eta SP = (t-t0)/t0$$

[Melting Point (Tm)]

Using DSC7 manufactured by PerkinElemer Inc., the obtained resin composition was temporarily held at 330° C. for 5 minutes, then cooled to 23° C. at a rate of 10° C./min and then heated at a rate of 10° C./min. The temperature at which an endothermic peak based on the melting of the resin composition at this heating process was identified was defined as a melting point.

[Initial Reflectance]

A resin composition was injection molded under the following molding conditions using the following molding machine to obtain a test piece of 30 mm in length, 30 mm in width, and 0.5 mm in thickness.

Molding machine: Sodick Plustech Co., Ltd., Tuparl TR40S3A

Cylinder temperature: melting point (Tm)+10° C., mold temperature: 120° C. The reflectance of the obtained test piece was determined in the wavelength region from 360 nm to 740 nm using CM3500d manufactured by Minolta Co., Ltd. The initial reflectance was evaluated by using the reflectance at 470 nm and 550 nm as a representative value.

[Reflectance after Heating]

The test piece used for the measurement of initial reflectance was allowed to stand in an oven at 170° C. for 2 hours. Subsequently, a temperature profile in which the preset temperature is held for 20 seconds was applied to the test piece using an air reflow soldering apparatus (AIS-20-82-C manufactured by Eightech Tectron Co., Ltd.), and the peak temperature was set at the same temperature as in the reflow step, that is, the peak temperature is a temperature higher than the preset temperature by 10° C. In this case, the peak temperature was set so as to be 260° C. at the surface of the test piece. This test piece was slowly cooled and then measured for the reflectance in the same manner as in the initial reflectance, and the resulting reflectance was defined as the reflectance after heating.

Example 1

A polyamide resin (A1), an inorganic reinforcing material (B 1), and a white pigment (C) were mixed in a proportion shown in Table 1 using a tumbler blender. The obtained mixture was melt-kneaded in a twin-screw extruder TEX30α manufactured by The Japan Steel Works, Ltd. at a cylinder temperature of 340° C. and then extruded into a strand shape. The strand was cooled in a water tank, drawn by a pelletizer, and cut to thereby obtain a resin composition in a pellet shape. The results of the evaluation of physical properties of the obtained resin compositions are shown in Table 1.

Polyamide Resin (A1)

Composition: dicarboxylic acid component unit (terephthalic acid/62.5 mol %, adipic acid/37.5 mol %, where the total of the dicarboxylic acid component units is 100 mol %); diamine component unit (1,6-diaminohexane/100 mol %, where the total of the diamine component unit is 100 mol %)

Intrinsic viscosity [η]: 0.8 dl/g
Melting point: 320° C.

Inorganic reinforcing material (B 1): calcium carbonate whisker (length: 25 μm, aspect ratio: 33)

White pigment (C): titanium oxide (powder, average particle size: 0.21 μm)

Example 2

A resin composition was obtained in substantially the same manner as in Example 1 except that a polyamide resin (A1-2) having the following composition, intrinsic viscosity, and melting point was used, and the cylinder temperature of the twin screw extruder was set at 320° C.; and the obtained resin composition was evaluated for physical properties.

Polyamide Resin (A1-2)

Composition: dicarboxylic acid component unit (terephthalic acid: 100 mol %, where the total of the dicarboxylic acid component unit is 100 mol %), Diamine component unit (1,12-diaminododecane: 100 mol %, where the total of the diamine component unit is 100 mol %), Intrinsic viscosity [η]: 0.8 dl/g
Melting point: 302° C.

Example 3

A resin composition was obtained in the same manner as in Example 1 except that a polycyclohexane dimethylene terephthalate resin (A2) having a melting point of 290° C. was used as a base polymer, and the cylinder temperature of the twin screw extruder was set at 310° C.; and the obtained resin composition was evaluated for physical properties.

Comparative Examples 1 to 3

A resin composition was obtained in the same manner as in Example 1 except that the polyamide resin (A1) was used as a base polymer, and the following was used as the inorganic reinforcing material (B); and the obtained resin composition was evaluated for physical properties.

(B2) Glass fiber: length: 3 mm, aspect ratio: 300 (ECS03-615 manufactured by Central Glass Co., Ltd., treated with a silane compound)

(B3) Wollastonite (calcium silicate): length: 50 μm, aspect ratio: 11

(B4) Potassium titanate whisker: length: 15 μm, aspect ratio: 33

TABLE 1

|  |  | UNIT | EXAMPLE 1 | EXAMPLE 2 | EXAMPLE 3 | COMPARATIVE EXAMPLE 1 | COMPARATIVE EXAMPLE 2 | COMPARATIVE EXAMPLE 3 |
|---|---|---|---|---|---|---|---|---|
| BASE POLYMER | (A1) | % BY MASS | 63 |  |  | 63 | 63 | 63 |
|  | (A1-2) | % BY MASS |  | 63 |  |  |  |  |
|  | (A2) | % BY MASS |  |  | 63 |  |  |  |
| REINFORCING MATERIAL | (B1) | % BY MASS | 17 | 17 | 17 |  |  |  |
|  | (B2) | % BY MASS |  |  |  | 17 |  |  |
|  | (B3) | % BY MASS |  |  |  |  | 17 |  |
|  | (B4) | % BY MASS |  |  |  |  |  | 17 |
| WHITE PIGMENT | (C) | % BY MASS | 20 | 20 | 20 | 20 | 20 | 20 |
| INITIAL REFLECTANCE | 470 nm | % | 86 | 89 | 90 | 85 | 85 | 82 |
|  | 550 nm | % | 90 | 90 | 91 | 87 | 85 | 80 |
| REFLECTANCE AFTER HEATING | 470 nm | % | 77 | 85 | 88 | 75 | 75 | 74 |
|  | 550 nm | % | 86 | 88 | 90 | 83 | 83 | 82 |
| FLEXURAL TEST (TOUGHNESS) |  | mJ | 45 | 53 | 35 | 32 | 39 | 37 |
| REFLOW HEAT RESISTANCE |  | ° C. | 275 | 275 | 270 | 275 | 275 | 265 |

As described above, it is found that the resin composition of the present invention has better balance between mechanical strength typified by a flexural test, heat resistance, reflectance, and retention of reflectance with time as compared with conventional resin compositions. Accordingly, the resin composition of the present invention is suggested to be suitable as a material, for example, for a reflector plate, particularly preferably, as a material for a LED reflector plate in which high heat resistance and reflectance retention are required.

It is estimated that the resin composition of the present invention has such a good performance balance because the dispersibility and compatibility between the specific inorganic filler (B), thermoplastic resin (A) and a white pigment (C) which are used in the present invention are good as described above.

Examples 4 to 6 and Comparative Example 4

Using a tumbler blender, 63% by weight of the following polyester resin (A2), 20% by weight of the above white pigment, and 17% by weight of the total of the inorganic fillers were mixed. The obtained mixture was melt-kneaded in a twin-screw extruder TEX30α manufactured by The Japan Steel Works, Ltd. at a cylinder temperature of 300° C. and then extruded into a strand shape. The strand was cooled in a water tank, drawn by a pelletizer, and cut to thereby obtain a resin composition in a pellet shape. The inorganic filler used is the same as the above calcium carbonate whisker and glass fibers.

Polyester Resin (A2)

Composition: dicarboxylic acid component unit (terephthalic acid: 100 mol %), diol component unit (cyclohexanedimethanol: 100 mol %)

Intrinsic viscosity [η]: 0.6 dl/g

Melting point: 290° C.

Next, the obtained resin composition was injection molded at a temperature of 295° C. using an SE50-type molding machine manufactured by Sumitomo Heavy Industries, Ltd. to obtain a test piece having a length in the MD direction of 50 mm, a length in the TD direction of 30 mm, and a thickness of 0.6 mm. The mold temperature was 150° C.

A mold was used having a recessed cavity in which a pair of parallel lines in the MD direction having a gap of 40 mm and a pair of parallel lines in the TD direction having a gap of 20 mm are formed.

The gap between the pair of parallel lines in the MD direction and that in the TD direction formed in the above test piece obtained immediately after molding were measured, and the percentage of shrinkage on the basis of the line spacing set in the mold was determined.

Further, the obtained test piece was stood for 2 hours in an oven maintained at 170° C. and slowly cooled to room temperature, and then the shrinkage percentage was determined in the same manner as described above. These results are shown in Table 2.

TABLE 2

|  |  |  | EXAMPLE 4 | EXAMPLE 5 | EXAMPLE 6 | COMPARATIVE EXAMPLE 4 |
|---|---|---|---|---|---|---|
| RATIO OF AMOUNTS BLENDED (/%) | | CALCIUM CARBONATE WHISKER | 100 | 50 | 29.4 | 0 |
| | | GLASS FIBER (GF) | 0 | 50 | 70.6 | 100 |
| SHRINKAGE PERCENTAGE (/%) | IMMEDIATELY AFTER MOLDING | MD | 0.79 | 0.52 | 0.42 | 0.31 |
| | | TD | 0.99 | 0.64 | 0.67 | 0.72 |
| | AFTER HEAT TREATMENT | MD | 0.9 | 0.63 | 0.49 | 0.32 |
| | | TD | 1.1 | 0.82 | 0.78 | 0.86 |

Figure 2:
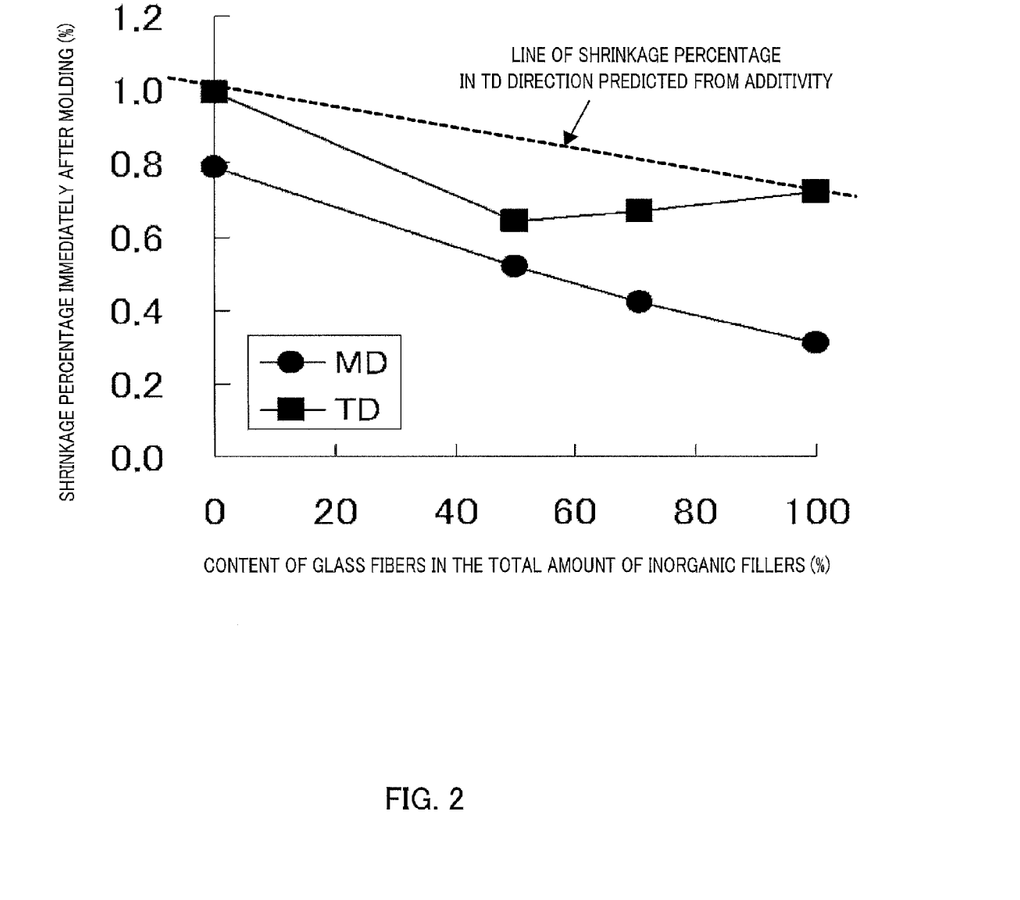
FIG. 2 illustrates the relationship between the content of glass fibers in the total amount of inorganic fillers and the shrinkage percentage immediately after molding of test pieces in Examples.
Figure 3:
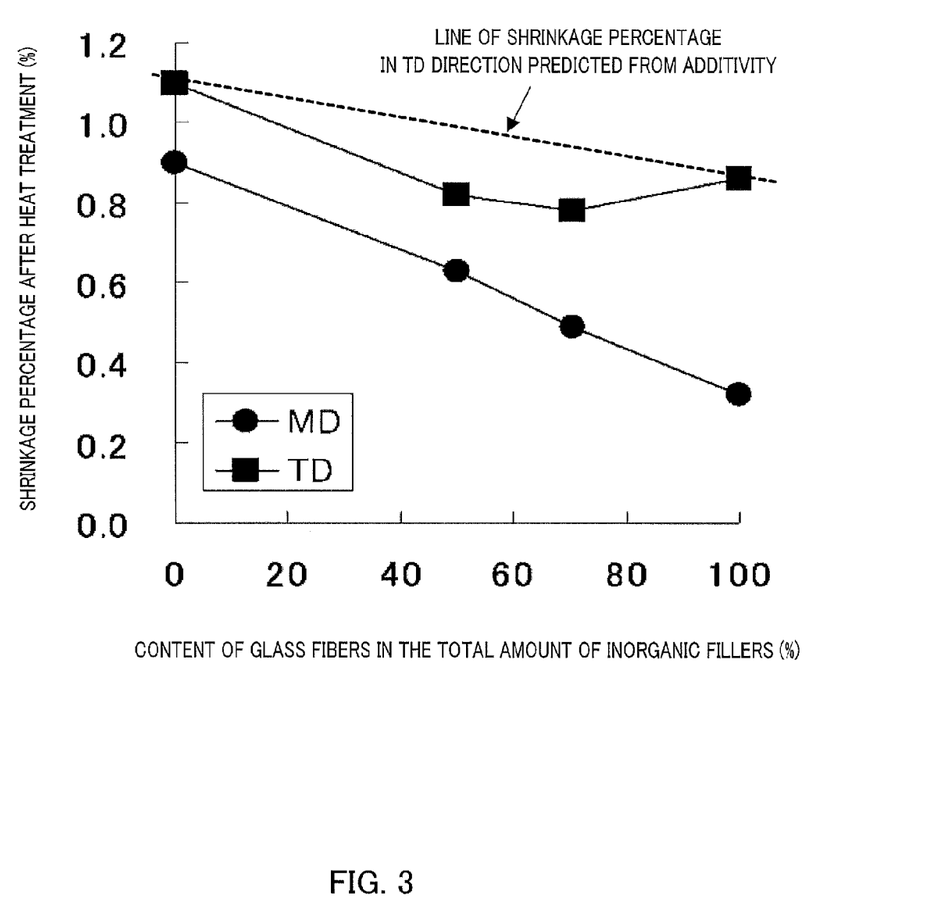
FIG. 3 illustrates the relationship between the content of glass fibers in the total amount of inorganic fillers and the shrinkage percentage after heat treatment of test pieces in Examples.

The above results are summarized in the graphs of FIG. 2 and FIG. 3. FIG. 2 illustrates the relationship between the content of glass fibers in the total amount of inorganic fillers and the shrinkage percentage immediately after molding of test pieces. FIG. 3 illustrates the relationship between the content of glass fibers in the total amount of inorganic fillers and the shrinkage percentage after heat treatment of test pieces. As shown in FIG. 2 and FIG. 3, it is found that the test pieces of Examples 5 and 6 in which calcium carbonate whiskers (inorganic filler (B-1)) and glass fibers (inorganic filler (B-2)) having a larger aspect ratio and average length than the former were used in combination show a tendency that the actual shrinkage percentage in the TD direction is lower than the shrinkage percentage in the TD direction predicted from the additivity (shrinkage percentage shown by the dotted lines of FIG. 2 and FIG. 3), the tendency is an unexpected result. Note that there has been obtained a result that the shrinkage percentage in the MD direction almost follows additivity as expected.

The present application claims the priority based on Japanese Patent Application No. 2011-128576 filed on Jun. 8, 2011 and Japanese Patent Application No. 2011-273927 filed on Dec. 14, 2011.

The invention claimed is:

1. A thermoplastic resin composition for a reflector comprising:
    30 to 80% by weight of a polyester resin (A-2) having a melting point or glass transition temperature of 250° C. or more, the polyester resin (A-2) containing: a dicarboxylic acid component unit (a-1) comprising 30 to 100 mol % of a terephthalic acid component unit, and 0 to 70 mol % of at least one compound selected from the group consisting of an aromatic dicarboxylic acid component unit other than terephthalic acid and a $C_{4\text{-}20}$ aliphatic dicarboxylic acid component unit; and a $C_{4\text{-}20}$ alicyclic dialcohol component unit (a-3);
    10 to 50% by weight of an inorganic filler (B) including a calcium carbonate whisker having an aspect ratio of 10 to 100; and
    5 to 50% by weight of a white pigment (C), wherein the total of the components (A-2), (B), and (C) is 100% by weight.
2. The thermoplastic resin composition for the reflector according to claim 1, wherein the dialcohol component unit (a-3) contained in the polyester resin (A-2) has a cyclohexane skeleton in a molecule thereof.

3. The thermoplastic resin composition for the reflector according to claim 1, wherein the inorganic filler (B) further comprises an inorganic filler (B-2) exclusive of the calcium carbonate whisker, the inorganic filler (B-2) having an aspect ratio and average length different from those of the calcium carbonate whisker.

4. The thermoplastic resin composition for the reflector according to claim 3, wherein the aspect ratio and average length of the inorganic filler (B-2) are larger than the aspect ratio and average length of the calcium carbonate whisker, and the ratio by weight of the content of the calcium carbonate whisker to the content of the inorganic filler (B-2) is calcium carbonate whisker/inorganic filler (B-2)=15/85 to 70/30.

5. The thermoplastic resin composition for the reflector according to claim 1, wherein the white pigment (C) is titanium oxide.

6. A reflector plate to be obtained by molding the thermoplastic resin composition for the reflector according to claim 1.

7. The reflector plate according to claim 6, wherein the reflector plate is for a light emitting diode element.

8. A light emitting diode element comprising the reflector plate according to claim 6.

* * * * *